United States Patent
Egelmeers et al.

(10) Patent No.: US 6,885,750 B2
(45) Date of Patent: Apr. 26, 2005

(54) ASYMMETRIC MULTICHANNEL FILTER

(75) Inventors: Gerardus Paul Maria Egelmeers, Eindhoven (NL); Jean Pierre Jallet, Leuven (BE)

(73) Assignee: Koninklijke Philips Electronics N.V., Eindhoven (NL)

( * ) Notice: Subject to any disclaimer, the term of this patent is extended or adjusted under 35 U.S.C. 154(b) by 474 days.

(21) Appl. No.: 10/055,397

(22) Filed: Jan. 22, 2002

(65) Prior Publication Data

US 2002/0176585 A1 Nov. 28, 2002

(30) Foreign Application Priority Data

Jan. 23, 2001 (EP) ............................................ 01200235

(51) Int. Cl.[7] .............................. H04B 3/20; H04B 3/00; H04B 1/00; A61F 11/00
(52) U.S. Cl. ............................ 381/66; 381/92; 381/119; 381/71.1
(58) Field of Search ..................... 381/66, 92, 111–115, 381/119, 1, 2, 10, 13, 71.1, 71.11

(56) References Cited

U.S. PATENT DOCUMENTS 4,829,378 A * 5/1989 LeGall ........................ 358/160
5,793,875 A * 8/1998 Lehr et al. .................. 381/68.1
6,449,586 B1 * 9/2002 Hoshuyana .................. 702/190

FOREIGN PATENT DOCUMENTS

EP                10052838 A1      11/2000

* cited by examiner

*Primary Examiner*—Forester W. Isen
*Assistant Examiner*—Elizabeth McChesney
(74) *Attorney, Agent, or Firm*—Edward W. Goodman

(57) ABSTRACT

A multi-channel filter (20) includes S inputs for receiving S input signals ($x_1 \ldots x_S$) and at least S filters (14, 28) coupled to the S inputs for filtering the input signals ($x_1 \ldots x_S$) or auxiliary signals ($y_1 \ldots y_S$) derived therefrom. The multi-channel filter (20) further includes a signal combiner (16) for combining the filtered signals into an output signal (ê) and a further signal combiner (22) coupled in between at least part of the inputs and at least part of the filters (14, 28). The further signal combiner (22) is arranged for combining at least part of the input signals ($x_1 \ldots x_S$) into at least one auxiliary signal ($y_1 \ldots y_S$) The multi-channel filter (20) is asymmetric in that at least one of the filters (28) has a filter length which is substantially larger than the filter lengths of the other filters (14). The asymmetric multi-channel filter combines a good convergence behavior with a low memory usage and can, for example, be used advantageously in multi-channel echo and noise cancellers.

9 Claims, 5 Drawing Sheets

ASYMMETRIC MULTICHANNEL FILTER

BACKGROUND OF THE INVENTION

I. Field of the Invention

The invention relates to a multi-channel filter.

The invention further relates to an acoustic echo canceller, a noise canceller, a voice controlled audio and/or video system, a audio and/or video conferencing system and to a multi-channel filtering method.

II. Description of the Related Art

Multichannel hands-free operation is becoming an increasingly important feature in modern communication systems. In audio and/or video conferencing systems, multi-channel transmission leads to a better 'localization' of the people in the rooms. This enhances the intelligibility and naturalness of the speech. Another important recent development is the development of voice controlled stereo (or multi-channel) audio- and video-equipment. The recognition rate of a voice recognition engine drops dramatically due to the sound emitted by the equipment. Besides that, it may recognize words emitted by the equipment itself. There is, therefore, a need for a multi-channel filter which functions as an acoustic echo canceling preprocessor for the voice recognition engine.

Such a multi-channel filter may be created by simply combining a number of single channel adaptive filters. However, such a multi-channel filter, in general has a very poor performance.

When the number of input signals in a multi-channel filter is larger than the number of independent signal (and noise) sources, there is no longer a unique solution for the adaptive filters. This is the so-called 'non-uniqueness' problem. In practice, however, the number of independent sources is always larger than the number of microphones due to noise and other disturbances. When, however, the power is not equally distributed over the independent sources, the problem might get badly conditioned, which is the main reason for the relatively bad performance of multi-channel adaptive filters. Methods have been proposed to increase their performance by using Recursive Least Squares (RLS)-like algorithms (that have a huge computational complexity, even the most efficient implementations), or by adding noise to the input signals, or by processing them in a non-linear way (which may lead to audible artifacts in the speaker signal(s)).

Similar problems arise in multi-channel noise cancellation, where noise that is picked up by a microphone is reduced using extra microphone signals as noise reference signals. The reference signals are filtered and subtracted from the (delayed) primary microphone signal.

In European Patent Application No. 1 052 838, corresponding to U.S. Pat. No. 6,738,480, a stereo frequency domain adaptive filter is disclosed. This multi-channel filter comprises two adaptive filters (one for each channel) for filtering the two input signals. The filtered signals are combined by means of an adder, and the combined signal is supplied to an output of the multi-channel filter. In the update of the two adaptive filters, transformed inverse auto- and cross-correlation matrices are used to improve the performance. This improves the convergence behavior without having a huge influence on the computational complexity compared to using two single channel adaptive filters.

The known multi-channel filter is relatively complex in that a relatively large number of filter coefficients need to be stored in memory.

SUMMARY OF THE INVENTION

It is an object of the invention to provide a multi-channel filter in which only a relatively small number of filter coefficients need to be stored in memory, while having a convergence behavior which is comparable to the known multi-channel filter. This object is achieved in the multi-channel filter according to the invention, said multi-channel filter comprising S inputs for receiving S input signals and at least S filters coupled to the S inputs for filtering the input signals or auxiliary signals derived therefrom, the multi-channel filter further comprising a signal combiner for combining the filtered signals into an output signal, with S being the number of channels of the multi-channel filter, the multi-channel filter comprising a further signal combiner coupled in between at least part of the inputs and at least part of the filters, the further signal combiner being arranged for combining at least part of the input signals into at least one auxiliary signal, wherein at least one of the filters has a filter length which is substantially larger than the filter lengths of the other filters.

The adaptive filters of the known multi-channel filter all have the same length, i.e., the same number of coefficients. The multi-channel filter according to the invention, is asymmetric in that not all of its filters have the same number of coefficients. Experiments have shown that such an asymmetric multi-channel filter with a number of short filters (i.e., having a relatively small number of coefficients) and a number of long filters (i.e., having a relatively large number of coefficients), these filters operating at least partly upon the auxiliary signal(s) (i.e., the combined input signals), can achieve a performance which is comparable to known multi-channel filters while having a substantially smaller number of filter coefficients which need to be stored in memory.

In an embodiment of the multi-channel filter according to the invention, the further signal combiner comprises an adder for deriving the at least one auxiliary signal from the S input signals. An adder provides a simple but effective implementation of the further signal combiner. It has been found that an asymmetric multi-channel filter, comprising filters with 128 coefficients (implementing a full decorrelating multi-channel algorithm) for all input signals and a single filter with 1024 coefficients (implementing the full decorrelating multi-channel algorithm for the first 128 coefficients and a single channel or mono algorithm for the 896 remaining coefficients) for an auxiliary signal which is the sum of all input signals has a performance which is comparable to the performance of the known multi-channel filter comprising filters with 1024 coefficients for all input signals.

In an embodiment of the multi-channel filter according to the invention, the further signal combiner is arranged for deriving the auxiliary signals ($y_1 \ldots y_S$) from the S input signals ($x_1 \ldots x_S$) according to:

$$y_1 = \sum_{i=1}^{S} x_i \text{ and } y_i = (S-1)x_{i-1} - x_S$$

for $1 < i \leq S$. By applying a long filter with length $L_1$ (implementing a decorrelating (multi-channel) algorithm on the first $L_2$ coefficients and a single channel algorithm on the remaining $L_1 - L_2$ coefficients) to $y_1$, and short filters with length $L_2$ (implementing the decorrelating algorithm) to $y_2 \ldots y_S$, an asymmetric multi-channel filter results which combines a good performance with a low memory usage.

In a further embodiment of the multi-channel filter, according to the invention, S is equal to 2 and the further signal combiner is arranged for deriving the auxiliary signals $(y_1, y_2)$ from the input signals $(x_1, x_2)$ according to:

$$y_1 = \frac{x_1 + x_2}{2} \text{ and } y_2 = \frac{x_1 - x_2}{2}.$$

By applying a long filter (implementing a single channel algorithm) to $y_1$ (or $y_2$) and a short filter (implementing a decorrelating algorithm) to $y_2$ (or $y_1$) an asymmetric stereo filter results which combines a good performance with a low memory usage. A measure of the performance of a multi-channel filter is the final misadjustment of the multi-channel filter. A multi-channel filter with a relatively good performance has a relatively small misadjustment. A multi-channel filter with a relatively bad performance has a relatively large misadjustment.

BRIEF DESCRIPTION OF THE DRAWINGS

The above object and features of the present invention will be more apparent from the following description of the preferred embodiments with reference to the drawings, wherein.

DESCRIPTION OF THE PREFFERED EMBODIMENTS

In the FIGS., identical parts are provided with the same reference numbers.

Figure 1:
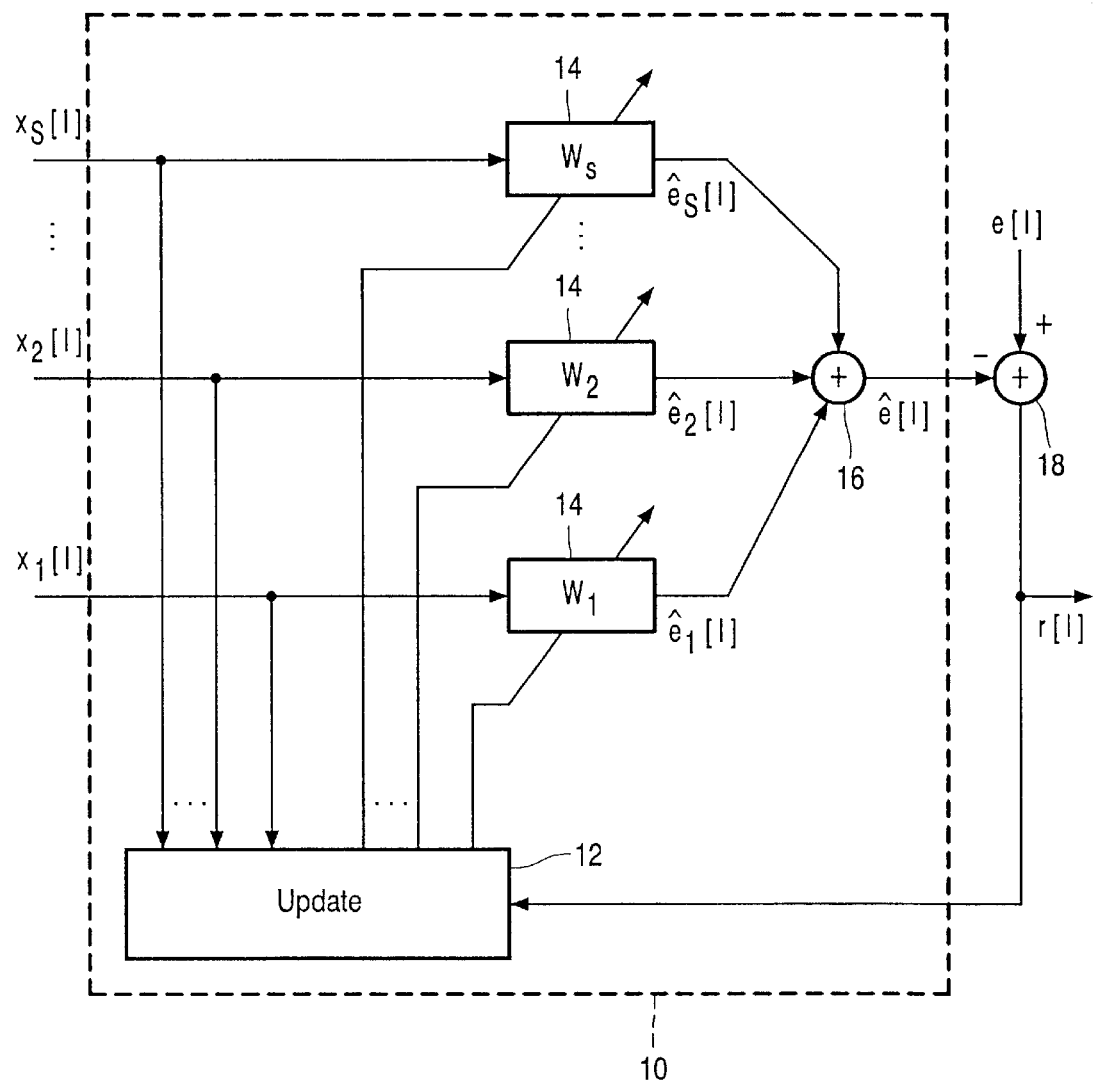
FIG. 1 shows a block diagram of a prior art multi-channel filter.

The multi-channel filter 10 according to FIG. 1 (with only two channels and operating in the frequency domain) is known from the above-mentioned European patent application. It is a multi-channel adaptive FIR filter with S channels. The multi-channel filter comprises S inputs for receiving S input signals $x_1 \ldots x_S$, and S filters 14 coupled to these inputs for filtering the input signals $x_1 \ldots x_S$. The multi-channel filter 10 further comprises a signal combiner 16 for combining the filtered signals $\hat{e}_1 \ldots \hat{e}_S$ into an output signal $\hat{e}$. The signal combiner 16 is implemented by an adder 16. The multi-channel filter 10 comprises update means 12 for updating the filter coefficients $W_1 \ldots W_S$ of the filters 14. The update means 12 is connected to the S inputs as well as to a further input via which a control signal r is supplied to the update means 12. The update means 12 implements an update algorithm which tries to adapt the filter coefficients $W_1 \ldots W_S$ in such a way that the correlation between the control signal r and the input signals $x_1 \ldots x_S$ is removed. In this prior-art multi-channel filter 10, the filters 14 all have the same length, i.e., the same number of filter coefficients. Furthermore, the update algorithm that is implemented in the update means 12 is the same for all filters 14.

Figure 2:
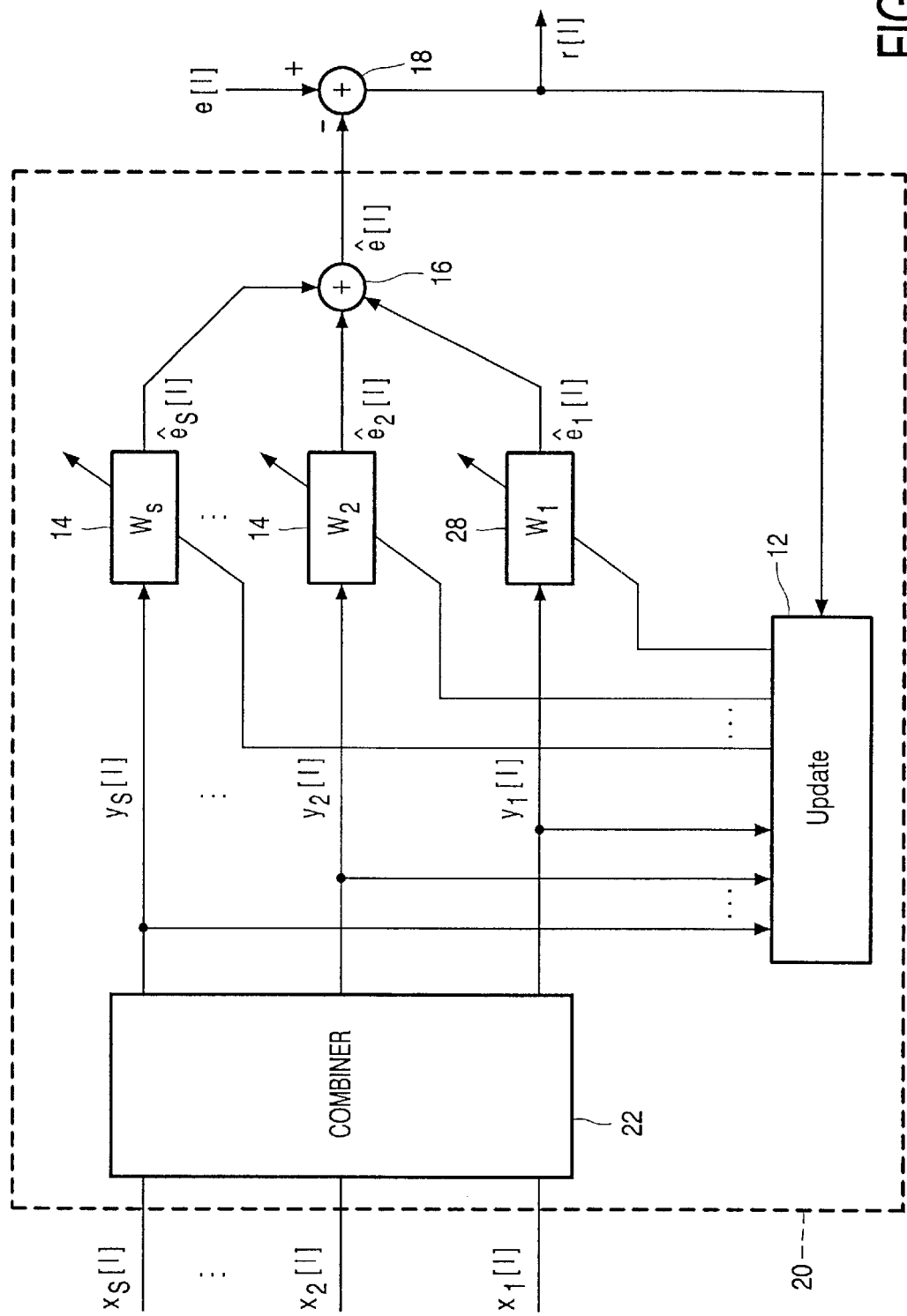
FIGS. 2 and 3 show block diagrams of embodiments of the multi-channel filter according to the invention.
Figure 3:
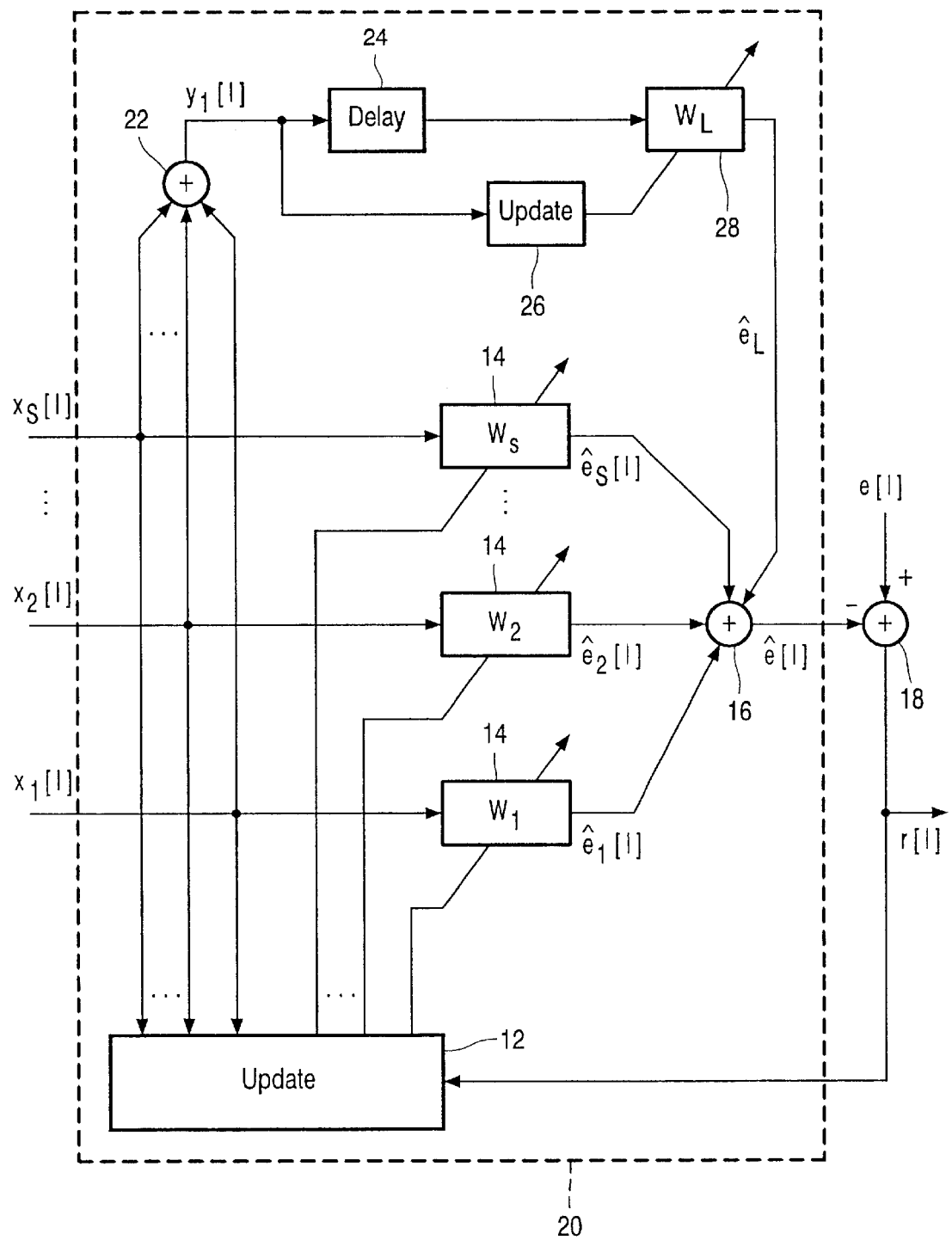

The multi-channel filters 10, 20 as shown in FIGS. 1 to 3 can be used advantageously as a multi-channel acoustic echo canceller. In such a context, the output signal $\hat{e}$ is an estimate of an undesired acoustic echo signal which is contained in a signal e. This estimate $\hat{e}$ is subtracted from the signal e by a subtracter 18 and the resulting residual signal r is substantially equal to the desired signal part of the signal e. The residual signal r is also used as the control signal r to control the multi-channel filter 10.

FIG. 2 shows a block diagram of a first embodiment of a multi-channel filter 20 according to the invention. The multi-channel filter 20 has S channels and comprises S inputs for receiving S input signals $x_1 \ldots x_S$ and S filters 14, 28 coupled to these inputs $x_1 \ldots x_S$. The multi-channel filter 20 further comprises a signal combiner 16 for combining the filtered signals $\hat{e}_1 \ldots \hat{e}_S$ into an output signal $\hat{e}$. The signal combiner 20 is implemented by an adder 16. The multi-channel filter 20 comprises an update means 12 which updates the filter coefficients $W_1 \ldots W_S$ of the filters 14, 28. The update means 12 is connected to the S inputs as well as to a further input via which a control signal r is supplied to the update means 12. The multi-channel filter 20 comprises a further signal combiner 22 coupled in between at least part of the inputs and at least part of the filters 14, 28. The further signal combiner 22 is arranged for combining at least part of the input signals $x_1 \ldots x_S$ into auxiliary signals $y_1 \ldots y_S$. The filters 14, 28 are arranged for filtering the auxiliary signals $y_1 \ldots y_S$ which have been derived from the input signals $x_1 \ldots x_S$ by the further signal combiner 22. The multi-channel filter 20 is asymmetric in that at least one of the filters 28 has a filter length which is substantially larger than the filter lengths of the other filters 14.

The further signal combiner 22 may derive the auxiliary signals $y_1 \ldots y_S$ from the input signals $x_1 \ldots x_S$ according to the following formulas:

$$y_1 = \sum_{i=1}^{S} x_i \qquad (1)$$

and $$y_i = (S-1)x_{i-1} - x_S \text{ for } 12I \; i \leq S \qquad (2)$$

The auxiliary signal $y_1$ is filtered by the long filter 28 and the auxiliary signals $y_2 \ldots y_S$ are filtered by the short filters 14. The update means 12 implements an update algorithm which tries to adapt the filter coefficients $W_1 \ldots W_S$ in such a way that the correlation between the control signal r and the auxiliary signals $y_1 \ldots y_S$ is removed. In the multi-channel filter 20, the update algorithm that is implemented in the update means 12 is not the same for all filters 14, 28, i.e., the update algorithm for the long filter 28 comprises a decorrelating algorithm for the first part of the long filter 28 (equal to the length of the short filters 14) and a single channel algorithm for the remaining part of the long filter 28, while the update algorithm for the short filters 14 is the decorrelating algorithm. The asymmetric multi-channel filter 20 combines a good performance with a low memory usage.

Alternatively, when the multi-channel filter 20 is a stereo filter with two channels, the further signal combiner 22 may derive the auxiliary signals $y_1 \ldots y_2$ from the input signals $x_1 \ldots x_2$ according to the following formulas:

$$y_1 = \frac{x_1 + x_2}{2} \qquad (3)$$

and $$y_2 = \frac{x_1 - x_2}{2} \qquad (4)$$

The auxiliary signal y1 may be filtered by a long filter 28 and the auxiliary signals y2 may be filtered by a short filter 14, or vice versa. The performance of this stereo filter 20 was verified by the following experiment in which the stereo filter 20 is used as a stereo acoustic echo canceller (stereo AEC). Assume that there is a room with two loudspeakers and a microphone. A music signal is played through the loudspeakers, and it is tried to cancel the contributions of the echoes from the loudspeakers recorded by the microphone by a stereo AEC. A frequency domain algorithm is used, with block length 128. First, the echoes were cancelled with a stereo AEC comprising the prior art stereo filter 10. Next, the echoes were cancelled with a stereo AEC comprising the stereo filter 20 as described above. The results of this experiment are listed in Table 1. In this table, the Echo Return Loss Enhancement (ERLE) is defined as −10 times the logarithm of the average squared remaining echo over the average squared echo at the microphone. Furthermore, Input 1 is the input/auxiliary signal that is supplied to a first filter having $N_1$ coefficients and Input 2 is the input/auxiliary signal that is supplied to a second filter having $N_2$ coefficients. The column labeled $N_1+N_2$ shows the total number of filter coefficients used by a certain configuration of the stereo filter. The rows labeled with Prior-art correspond with the prior art stereo filter 10.

The rows labeled with Asymmetric correspond with the stereo filter 20 according to the invention.

TABLE 1

| Filter type | Input 1 | $N_1$ | Input 2 | $N_2$ | ERLE | $N_1 + N_2$ |
|---|---|---|---|---|---|---|
| Prior-art | $x_1$ | 512 | $x_2$ | 512 | 15.2 dB | 1024 |
| Prior-art | $x_1$ | 768 | $x_2$ | 768 | 18.3 dB | 1536 |
| Prior-art | $x_1$ | 1024 | $x_2$ | 1024 | 20.4 dB | 2048 |
| Asymmetric | $(x_1 + x_2)/2$ | 512 | $(x_1 - x_2)/2$ | 128 | 15.0 dB | 640 |
| Asymmetric | $(x_1 + x_2)/2$ | 768 | $(x_1 - x_2)/2$ | 128 | 17.9 dB | 896 |
| Asymmetric | $(x_1 + x_2)/2$ | 896 | $(x_1 - x_2)/2$ | 128 | 19.4 dB | 1024 |
| Asymmetric | $(x_1 + x_2)/2$ | 1024 | $(x_1 - x_2)/2$ | 128 | 20.0 dB | 1152 |
| Asymmetric | $(x_1 + x_2)/2$ | 1536 | $(x_1 - x_2)/2$ | 128 | 20.1 dB | 1664 |
| Asymmetric | $(x_1 + x_2)/2$ | 512 | $(x_1 - x_2)/2$ | 256 | 15.1 dB | 768 |
| Asymmetric | $(x_1 + x_2)/2$ | 768 | $(x_1 - x_2)/2$ | 256 | 18.1 dB | 1024 |
| Asymmetric | $(x_1 + x_2)/2$ | 1024 | $(x_1 - x_2)/2$ | 256 | 19.8 dB | 1280 |
| Asymmetric | $(x_1 + x_2)/2$ | 1536 | $(x_1 - x_2)/2$ | 256 | 20.8 dB | 1792 |
| Asymmetric | $(x_1 + x_2)/2$ | 768 | $(x_1 - x_2)/2$ | 512 | 18.3 dB | 1280 |
| Asymmetric | $(x_1 + x_2)/2$ | 1024 | $(x_1 - x_2)/2$ | 512 | 20.6 dB | 1536 |
| Asymmetric | $(x_1 + x_2)/2$ | 1536 | $(x_1 - x_2)/2$ | 512 | 20.9 dB | 2048 |
| Asymmetric | $(x_1 + x_2)/2$ | 1024 | $(x_1 - x_2)/2$ | 768 | 20.6 dB | 1792 |

From these results, it is clear that the stereo AEC with the stereo filter 20 can achieve (almost) the same reduction in residual echo level as the stereo AEC with the prior art stereo filter 10, while using much less coefficients/memory, in total. For example, the prior art stereo filter 10 needs 2048 coefficients to reach an ERLE of 20.4 dB. In contrast, the asymmetric stereo filter 20 needs only 1152 coefficients to reach a comparable ERLE of 20.0 dB.

In order to implement the formulas (1) to (4), the further signal combiner 22 may comprise adders, subtracters, multipliers and/or dividers.

FIG. 3 shows a block diagram of a second embodiment of a multi-channel filter 20 according to the invention. The multi-channel filter 20 has S channels and comprises S inputs for receiving S input signals $x_1 \ldots x_S$, and S short filters 14 coupled to these inputs $x_1 \ldots x_S$. The multi-channel filter 20 comprises update means 12 for updating the filter coefficients $W_1 \ldots W_S$ of the filters 14. The update means 12 is connected to the S inputs as well as to a further input via which a control signal r is supplied to the update means 12. The multi-channel filter 20 comprises an adder 22 which functions as a further signal combiner 22 and which combines the input signals $x_1 \ldots x_S$ into an auxiliary signal $y_1$. The auxiliary signal $y_1$ is delayed by a delay element 24 in order to compensate for the delay of the filters 14. The delayed auxiliary signal y1 is thereafter filtered by a long filter 28. The coefficients $W_L$ of filter 28 are updated by a further update means 26. The multi-channel filter 20 further comprises a signal combiner 16 for combining the filtered signals $\hat{e}_1 \ldots \hat{e}_S$ and $\hat{e}_L$ into an output signal $\hat{e}$. The signal combiner 20 is implemented by an adder 16.

Figure 4:
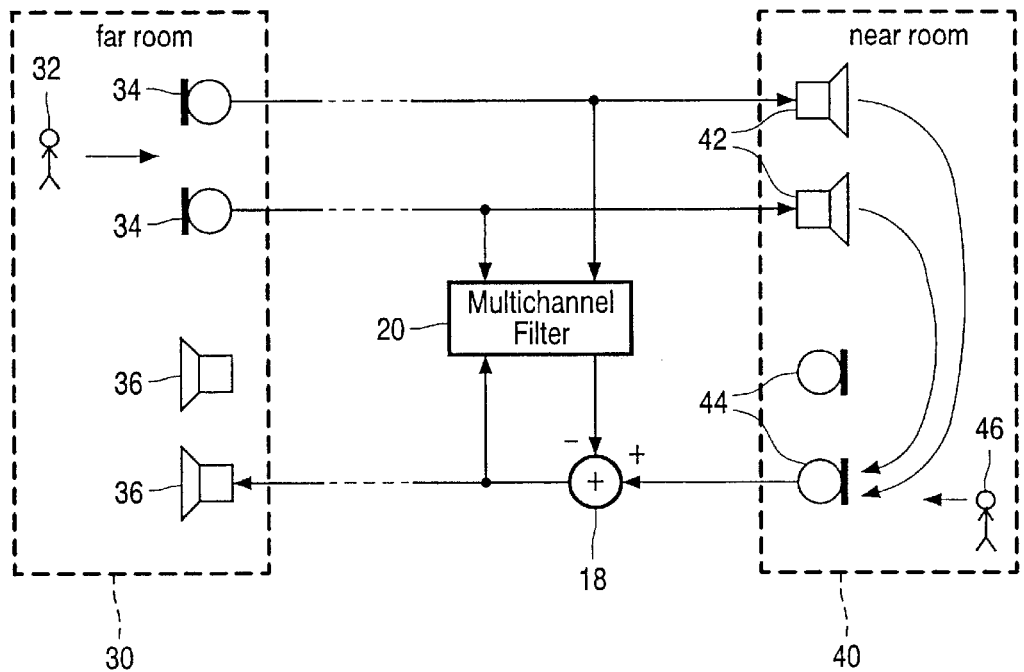
FIG. 4 shows a block diagram of an audio and/or video conferencing system according to the invention.

FIG. 4 shows a block diagram of an audio and/or video conferencing system according to the invention. In the audio and/or video conferencing system, a near room 40 and a far room 30 are connected with each other by a stereo connection. Four stereo acoustic echo cancellers (stereo AEC) 20 are included in the system to cancel the acoustic echoes in both rooms 30 and 40. In FIG. 4, only one of these stereo AECs 20 is shown. The stereo AEC 20 is the stereo filter 20 according to the invention. In the far room 30, a person 32 is speaking and the sounds in the far room 30 (including the speech) are picked up by two microphones 34 and transmitted to the near room 40. In the near room 40, the picked up sounds from the far room 30 are supplied to and reproduced by two loudspeakers 42. In the near room 40, there is another person 46 who is speaking, and the sounds in the near room 30 (including the speech of person 46 and the echoes of the sounds of the far room 30) are picked up by two microphones 44 and supplied to a subtracter 18. The stereo filter 20 determines, from the far room signals, an estimate of the echoes in the near room 40. This estimate is subtracted by the subtracter 18 from the signal picked up by the microphones 44. The resulting residual signal is then supplied to loudspeakers 36 in the far room 30. The residual signal is also used as a control signal to control the stereo filter 20.

Figure 5:
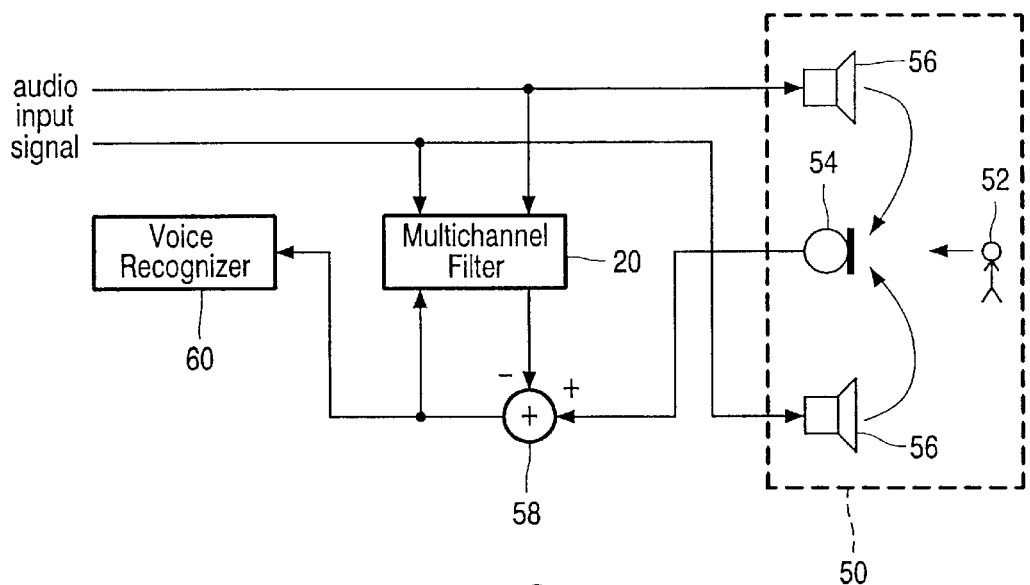
FIG. 5 shows a block diagram of a voice-controlled audio and/or video system according to the invention.

FIG. 5 shows a block diagram of a voice-controlled audio and/or video system according to the invention. In this system, a stereo (or multi-channel) audio input signal is supplied in a room 50 to two loudspeakers 56. A person 52 in the room 50 can control the system by voice commands. The voice commands, together with echoes of the stereo audio signal, are picked up by a microphone 54 and supplied to a subtracter 58. A multi-channel filter 20 is fed with the stereo audio input signal and determines an estimate of the echoes of the stereo audio signal. This estimate is subtracted by the subtracter 58 from the signal picked up by the microphone 54, and the resulting residual signal is supplied to a voice recognizer 60. The residual signal is also used as a control signal to control the multi-channel filter 20.

Figure 6:
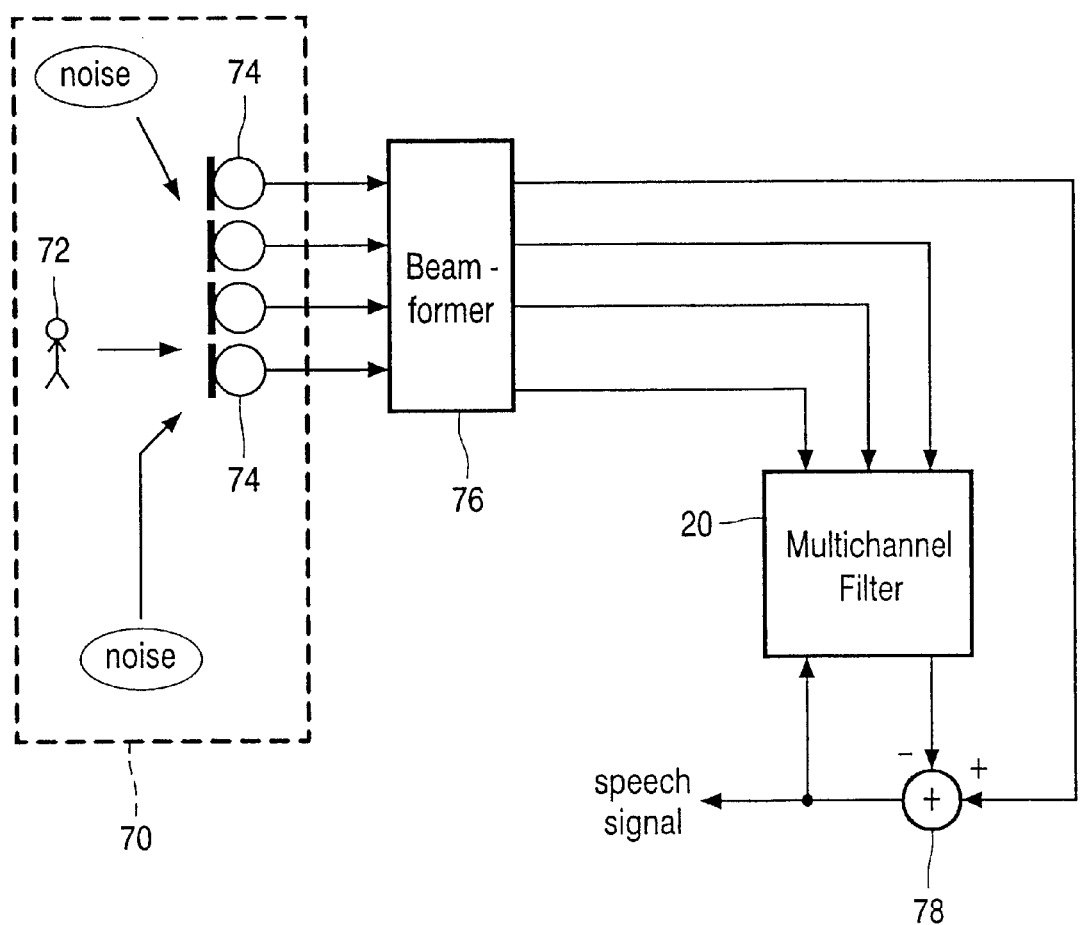
FIG. 6 shows a block diagram of a noise canceller according to the invention.

FIG. 6 shows a block diagram of a noise canceller according to the invention. In a room 70, a number of microphones 74 are located which are coupled to a microphone beamformer 76. The microphones 74 pick up speech uttered by a person 72 and also noise which is present in the room 70. The beamformer 76 selects the best one of the signals supplied by the microphones 74 and supplies this signal to a subtracter 78. The beamformer 76 supplies the signals picked up by the other microphones 74 to a multi-channel filter 20 which determines an estimate of the noise included in the best microphone signal. This estimate is supplied to the subtracter 78 and the estimate is subtracted from the best microphone signal. The resulting residual signal is a cleaned up speech signal. The residual signal is also used as a control signal to control the stereo filter 20.

The multi-channel filter 20 according to the invention, may be implemented by digital hardware or by software which is executed by a digital signal processor or by a general purpose microprocessor. Furthermore, the multi-channel filter 20 may be implemented in the frequency domain or in the time domain.

The scope of the invention is not limited to the embodiments explicitly disclosed. The invention is embodied in each new characteristic and each combination of characteristics. Any reference signs do not limit the scope of the claims. The word "comprising" does not exclude the presence of other elements or steps than those listed in a claim. Use of the word "a" or "an" preceding an element does not exclude the presence of a plurality of such elements.

What is claimed is:

1. A multi-channel filter comprising:

S inputs for receiving S input signals ($x_1 \ldots x_S$);

at least S filters coupled to the S inputs for filtering the input signals ($x_1 \ldots x_S$) or auxiliary signals ($y_1 \ldots y_S$) derived therefrom;

a signal combiner for combining the filtered signals into an output signal ($\hat{e}$), with S being the number of channels of the multi-channel filter;

a further signal combiner coupled in between at least part of the inputs and at least part of the filters, the further signal combiner combining at least part of the input signals ($x_1 \ldots x_S$) into at least one auxiliary signal ($y_1 \ldots y_S$), wherein at least one of the filters has a filter length which is substantially larger than the filter lengths of the other filters.

2. The multi-channel filter as claimed in claim 1, wherein the further signal combiner comprises an adder for deriving the at least one auxiliary signal ($y_1$) from the S input signals ($x_1 \ldots x_S$).

3. The multi-channel filter claimed in claim 2, wherein the further signal combiner derives the auxiliary signals ($y_1 \ldots y_S$) from the S input signals ($x_1 \ldots x_S$) according to:

$$y_1 = \sum_{i=1}^{S} x_i \text{ and } y_i = (S-1)x_{i-1} - x_S$$

for $1 < i \leq S$.

4. The multi-channel filter as claimed in claim 1, wherein S is equal to 2, and wherein the further signal combiner derives the auxiliary signals ($y_1, Y_2$) from the input signals ($x_1, x_2$) according to:

$$y_1 = \frac{x_1 + x_2}{2} \text{ and } y_2 = \frac{x_1 - x_2}{2}.$$

5. An acoustic echo canceller including a multi-channel filter comprising:

S inputs for receiving S input signals ($x_1 \ldots x_S$);

at least S filters (14, 28) coupled to the S inputs for filtering the input signals ($x_1 \ldots x_S$) or auxiliary signals ($y_1 \ldots y_S$) derived therefrom, a signal combiner for combining the filtered signals into an output signal ($\hat{e}$), with S being the number of channels of the multi-channel filter; and a further signal combiner coupled in between at least part of the inputs and at least part of the filters, the further signal combiner combining at least part of the input signals ($x_1 \ldots x_S$) into at least one auxiliary signal ($y_1 \ldots Y_S$), wherein at least one of the filters has a filter length which is substantially larger than the filter lengths of the other filters.

6. A noise canceller including a multi-channel filter comprising:

S inputs for receiving S input signals ($x_1 \ldots x_S$);

at least S filters coupled to the S inputs for filtering the input signals ($x_1 \ldots x_S$) or auxiliary signals ($y_1 \ldots y_S$) derived therefrom;

a signal combiner for combining the filtered signals into an output signal ($\hat{e}$), with S being the number of channels of the multi-channel filter; and a further signal combiner coupled in between at least part of the inputs and at least part of the filters, the further signal combiner combining at least part of the input signals ($x_1 \ldots x_S$) into at least one auxiliary signal ($y_1 \ldots y_S$), wherein at least one of the filters has a filter length which is substantially larger than the filter lengths of the other filters.

7. A voice-controlled audio and/or video system including a multi-channel filter comprising:

S inputs for receiving S input signals ($x_1 \ldots x_S$);

at least S filters coupled to the S inputs for filtering the input signals ($x_1 \ldots x_S$) or auxiliary signals ($y_1 \ldots y_S$) derived therefrom;

a signal combiner for combining the filtered signals into an output signal ($\hat{e}$), with S being the number of channels of the multi-channel filter; and a further signal combiner coupled in between at least part of the inputs and at least part of the filters, the further signal combiner combining at least part of the input signals ($x_1 \ldots x_S$) into at least one auxiliary signal ($y_1 \ldots y_S$), wherein at least one of the filters has a filter length which is substantially larger than the filter lengths of the other filters.

8. An audio and/or video conferencing system including an acoustic echo canceller with a multi-channel filter, said multi-channel filter comprising:

S inputs for receiving S input signals ($x_1 \ldots x_S$);

at least S filters coupled to the S inputs for filtering the input signals ($x_1 \ldots x_S$) or auxiliary signals ($y_1 \ldots y_S$) derived therefrom;

a signal combiner for combining the filtered signals into an output signal ($\hat{e}$), with S being the number of channels of the multi-channel filter; and a further signal combiner coupled in between at least part of the inputs and at least part of the filters, the further signal combiner combining at least part of the input signals ($x_1 \ldots x_S$) into at least one auxiliary signal ($y_1 \ldots y_S$), wherein at least one of the filters has a filter length which is substantially larger than the filter lengths of the other filters.

9. A multi-channel filtering method, the method comprising the steps of:

combining at least part of S input signals ($x_1 \ldots x_S$) into at least one auxiliary signal ($y_1 \ldots y_S$);

filtering the input signals ($x_1 \ldots x_S$) and/or the at least one auxiliary signal ($y_1 \ldots y_S$) using at least S filters, wherein at least one of the filters has a filter length which is substantially larger than the filter lengths of the other filters; and combining the filtered signals into an output signal ($\hat{e}$).

* * * * *